United States Patent
Kang et al.

(10) Patent No.: US 7,491,968 B2
(45) Date of Patent: Feb. 17, 2009

(54) MEMORY DEVICE USING QUANTUM DOTS

(75) Inventors: Yoon Sok Kang, Seongnam-si (KR);
Sang Kyun Lee, Seongnam-si (KR);
Won Jae Joo, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 160 days.

(21) Appl. No.: 11/230,530

(22) Filed: Sep. 21, 2005

(65) Prior Publication Data

US 2007/0221986 A1  Sep. 27, 2007

(30) Foreign Application Priority Data

Dec. 24, 2004  (KR)  .................. 10-2004-0111925

(51) Int. Cl.
*H01L 51/00* (2006.01)

(52) U.S. Cl. .......... 257/40; 257/E51.003; 257/E51.029; 257/E51.03; 257/E51.034; 438/99; 438/381; 977/753; 977/783

(58) Field of Classification Search ................. 438/99, 438/381; 257/40, E51.027, E29.071, E29.17, 257/E51.003, E51.029, E51.03, E51.034, 257/E27.117; 977/753, 783
See application file for complete search history.

(56) References Cited

U.S. PATENT DOCUMENTS

| | | | |
|---|---|---|---|
| 6,055,180 A | | 4/2000 | Gudesen et al. |
| 7,057,206 B2 | | 6/2006 | Halik et al. |
| 7,065,285 B2 * | | 6/2006 | Chen et al. ................. 385/141 |
| 2002/0163057 A1 | | 11/2002 | Bulovic et al. |
| 2005/0072989 A1 * | | 4/2005 | Bawendi et al. ............ 257/200 |
| 2005/0227382 A1 * | | 10/2005 | Hui .............................. 438/14 |
| 2005/0270442 A1 * | | 12/2005 | Yang et al. .................. 349/86 |
| 2005/0274943 A1 * | | 12/2005 | Chen .......................... 257/40 |
| 2005/0287717 A1 * | | 12/2005 | Heald et al. ................. 438/128 |

FOREIGN PATENT DOCUMENTS

| | | |
|---|---|---|
| JP | 62-95882 | 5/1987 |
| KR | 1020047017341 A | 12/2004 |

OTHER PUBLICATIONS

R.E. Thurstans et al., "The electroformed metal-insulator-metal structure: a comprehensive model", J. Phys. D: Appl. Phys. 35, 2002, pp. 802-809.
L.P. Ma et al., "Organic electrical bistable devices and rewritable memory cells", Applied Physics Letters, vol. 80, No. 16, Apr. 22, 2002, pp. 2997-2999.
Liping. Ma et al.,"Nonvolatile electrical bistability of organic/metal-nanocluster/organid system", Applied Physics Letters, vol. 82, No. 9, Mar. 3, 2003, pp. 1419-1421.
Korean Office Action dated Apr. 14, 2008 and English translation.

* cited by examiner

*Primary Examiner*—Matthew Smith
*Assistant Examiner*—Julio J. Maldonado
(74) *Attorney, Agent, or Firm*—Buchanan Ingersoll & Rooney PC

(57) ABSTRACT

A memory device, which includes a memory layer having quantum dots uniformly dispersed in organic material disposed between an upper electrode layer and a lower electrode layer. The memory device is advantageous because it is nonvolatile and inexpensive, and realizes high integration and high speed switching. Further, size and distribution of the quantum dots may be uniform, thus realizing uniform memory behavior. Furthermore, the memory device is suitable for application to portable electronic devices that must have low power consumption, due to low operating voltages thereof.

29 Claims, 3 Drawing Sheets

MEMORY DEVICE USING QUANTUM DOTS

BACKGROUND OF THE INVENTION

This non-provisional application claims priority under 35 U.S.C. § 119(a) on Korean Patent Application No. 2004-111925 filed on Dec. 24, 2004, which is herein expressly incorporated by reference.

1. Field of the Invention

Embodiments of the present invention relate, generally, to a memory device, and, more particularly, to a memory device including a memory layer having quantum dots uniformly dispersed in an organic material disposed between an upper electrode layer and a lower electrode layer, which is advantageous because it is nonvolatile and inexpensive, and realizes high integration, low power consumption, and high speed switching.

2. Description of the Related Art

With the rapid development of the information and communication industries, the demand for various memory devices has drastically increased. In particular, memory devices used for portable terminals, various smart cards, electronic money, digital cameras, games, MP3 players, etc. must be nonvolatile, so that the recorded information is not lost even when no power is consumed. A typical representative of the nonvolatile memory is flash memory, which is formed of a silicon material and has monopolized the memory market.

However, conventional flash memory is disadvantageous because it may be recorded and erased a limited number of times and has a slow recording speed. Further, in order to manufacture flash memory having a high memory capacity, line width per unit area should be decreased, which increases process costs resulting in high costs to manufacture memory chips. Moreover, due to difficulties in chip manufacturing techniques it is difficult to further miniaturize the chips. Due to technical limitations imposed on manufacturing the conventional silicon flash memory, attempts to develop next-generation nonvolatile memory devices, which realize ultra-high speeds, high capacities, low power consumption, and low prices while overcoming the physical limitations of the above memory devices, have been vigorously made.

The next-generation memory devices include, for example, ferroelectric RAM, magnetic RAM, phase change RAM, nanotube memory, holographic memory, organic memory, etc., depending on the kind of material constituting a unit cell in a semiconductor. Of these memory devices, organic memory achieves memory capability using bistable resistance values caused by applying voltage to an organic material layer positioned between upper and lower electrode layers. That is, the organic memory is a type of memory that is able to read and write data '0' and '1' while the resistance or capacitance of the organic material present between the upper and lower electrode layers is reversibly changed in response to electrical signals. Thus, the organic memory functions to solve the problems of processability, manufacturing costs and integration, while exhibiting the nonvolatile characteristics of conventional flash memory, and is widely expected to be the next-generation memory technology.

In this regard, Japanese Patent Laid-open Publication No. Sho. 62-95882 discloses an electrical memory device using CuTCNQ (7,7,8,8-tetracyano-p-quinodimethane) as a charge transfer complex containing an organic metal. U.S. Serial No. 2002-163057 discloses a semiconductor device including a middle layer made of a mixture of an ionic salt such as NaCl or CsCl and a conductive polymer, interposed between upper and lower electrode layers. Such a device manifests switching/memory properties by charge separation in an electrical field. In addition, U.S. Pat. No. 6,055,180 discloses a memory device using ferroelectricity depending on a crystalline phase of a fluorine based polymer, such as poly(vinyldifluoroethylene).

On the other hand, the manufacturing method of the conventional organic memory device further includes an electroforming process, which applies high voltage to the manufactured memory device. As such, the electroforming process is used to pulverize a metal for an electrode to ones of nm size and then allow the pulverized metal to move between organic layers (J. Phys. D: Appl. Phys., 35, 802 (2002)). In the electroformed memory device, an NDR (Negative Differential Resistance) section is formed, thus manifesting memory properties. However, since the electroforming process cannot control the size or size distribution of metal particles, the physical properties of the devices are inconsistent. At this time, memory behavior, as well as the operating voltage and operating current of the memory device, varies and contributes to inconsistent device properties, which reduces the reproducibility and results in severely defective products. To omit the electroforming process, methods of forming a metal layer embedded within the organic material have been proposed (Appl. Phys. Lett., 80, 2997 (2002) and Appl. Phys. Lett., 82, 1419 (2003)). As such, however, it is difficult to control the size of metal particles and interparticle intervals. Further, only when depositing the metal at a very low speed are desired memory properties obtained, and thus, the above method cannot be actually applied.

OBJECTS AND SUMMARY

Accordingly, embodiments of the present invention have been made keeping in mind the above problems occurring in the related art, and an object of embodiments of the present invention is to provide a memory device, which is advantageous because it is nonvolatile and is manufactured less expensively by a simple process.

Another object of embodiments of the present invention is to provide a nonvolatile memory device, which manifests high integration, low power consumption and high speed switching.

A further object of embodiments of the present invention is to provide a memory device, which exhibits uniform memory behavior due to uniform operating voltage and operating current of the memory device without the need for electroforming.

In order to accomplish the above objects, embodiments of the present invention provide a memory device, which may include a memory layer having quantum dots uniformly dispersed in an organic material disposed between upper and lower electrode layers.

BRIEF DESCRIPTION OF THE DRAWINGS

The above and other objects, features and advantages of embodiments of the present invention will be more clearly understood from the following detailed description taken in conjunction with the accompanying drawings, in which.

DETAILED DESCRIPTION OF THE PREFERRED EMBODIMENTS

Hereinafter, a detailed description will be given of embodiments of the present invention, with reference to the appended drawings.

Figure 1:
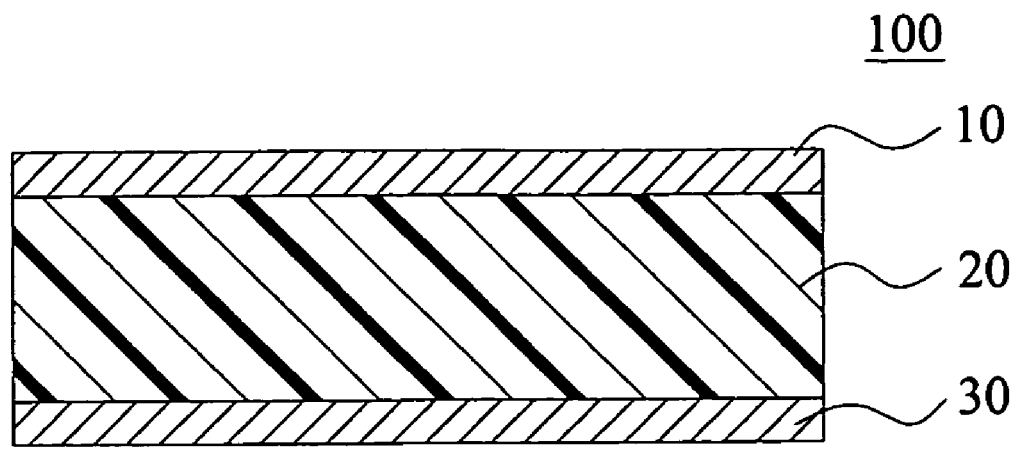
FIG. 1 is a schematic sectional view showing a memory device according to an embodiment of the present invention.

FIG. 1 is a schematic sectional view showing a memory device according to an embodiment of the present invention. As shown in FIG. 1, the memory device 100 of an embodiment of the present invention includes an upper electrode layer 10, a lower electrode layer 30, and a memory layer 20 sandwiched between the upper electrode layer 10 and the lower electrode layer 30. The memory layer 20 preferably has quantum dots uniformly dispersed in an organic material disposed between the upper electrode layer 10 and the lower electrode layer 30. In the memory device 100, the quantum dots may be used as a charge trapping site. Thus, when voltage is applied to the memory device, the memory layer of the device shows bistable resistance values, therefore realizing desired memory properties.

The memory device of embodiments of the present invention stores information in a manner different from conventional silicon devices. Although the conventional silicon device codes "0" or "1" depending on magnitudes of charges stored in cells thereof, embodiments of the inventive memory device store information using variation in the electrical resistance of the memory layer. A memory device of embodiments of the present invention is operated as follows. In the initial state, values of current and voltage are '0'. When voltage is applied to the memory device in the off state (high resistance and low conductivity), current increases in proportion to the voltage from the application of 0 V until a point called the voltage threshold ($V_{TH}$) is reached. At this point the current reaches a maximum value, at which the memory device is rapidly switched to a low resistance state (on state). The memory device maintains the on state until the higher off voltage is applied thereto. In this way, since the memory layer of the device has two resistance states, the memory device can exhibit memory properties.

In embodiments of the present invention, the quantum dots may be synthesized using various materials. When the quantum dots are prepared to have a uniform particle size, the physical properties of a memory device according to embodiments of the present invention are more easily predicted and controlled than those of electroformed devices. Further, the size of quantum dots is controllable depending on the synthesis methods, and thus, quantum dots having various band gaps are used as a memory material. In addition, the quantum dots, which may be dissolved in an organic solvent, are dissolved in a cosolvent along with a polymer to prepare a coating solution, which may then be used for spin coating, thereby achieving uniform dispersion.

Figure 3:
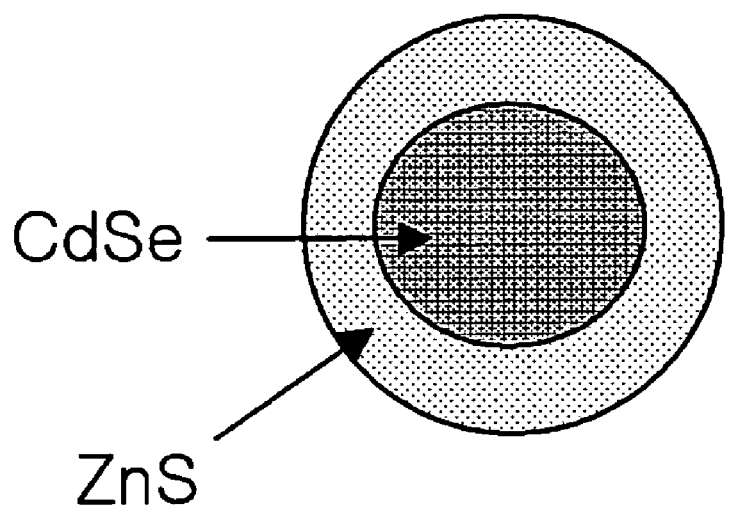
FIG. 3 is a schematic view showing the structure of quantum dots used in embodiments of the present invention.

The quantum dots used in embodiments of the present invention may be Group II-VI quantum dots, Group III-V quantum dots, or Group IV quantum dots. Preferably, the quantum dots are exemplified by CdS, CdSe, CdTe, ZnS, ZnSe, ZnTe, GaN, GaP, GaAs, GaSb, AlN, AlP, AlAs, AlSb, InP, InAs, InSb, and SiC, but are not limited thereto. In addition, quantum dots having a core-shell alloy structure may be used. As such, the core-shell structure of the quantum dots may comprise a core formed of a Group II-VI compound semiconductor and a shell formed of a Group II-VI compound semiconductor. The quantum dot having a core-shell alloy structure is depicted in FIG. 3. A quantum dot shown in FIG. 3 comprises a core of CdSe and a shell of ZnS. Although the size of the quantum dots usable in embodiments of the present invention is not particularly limited, it preferably ranges from 2 to 10 nm.

The quantum dots may be prepared by a process using an organometallic chemical vapor deposition (OMCVD) system or a molecular beam epitaxy (MBE) system, a wet chemical process, or other suitable processes known to those skilled in the art.

The organic material constituting the memory layer 20 is preferably a conductive polymer. The conductive polymer is exemplified by polydiphenylacetylene, poly(t-butyl)diphenylacetylene, poly(trifluoromethyl)diphenylacetylene, poly(bistrifluoromethyl)acetylene, polybis(tbutyldiphenyl)acetylene, poly(trimethylsillyl)diphenylacetylene, poly(carbazole)diphenylacetylene, polydiacetylene, polyphenylacetylene, polypyridineacetylene, polymethoxyphenylacetylene, polymethylphenylacetylene, poly (t-butyl)phenylacetylene, polynitrophenylacetylene, poly(trifluoromethyl)phenylacetylene, poly(trimethylsillyl)phenylacetylene, polyanilines, polythiophenes, polypyrroles, polysilanes, polystyrenes, polyfurans, polyindoles, polyazulenes, polyphenylenes, polypyridines, polybipyridines, polyphthalocyanines, poly(ethylenedioxythiophenes), and derivatives thereof, but is not limited thereto.

The memory layer 20 of embodiments of the present invention may be formed using a spin coating process, an inkjet printing process, a roll-to-roll coating process, a thermal deposition process, etc. The memory layer 20 preferably has a thickness ranging from about 50 to 3000 Å. The solvent used for spin coating is selected from the group consisting of acetone, cyclopentanone, cyclohexanone, methylethylketone ethylcellosolveacetate, butylacetate, ethyleneglycol, toluene, xylene, chloroform, tetrahydrofuran, dimethylformamide, acetonitrile, and chlorobenzene. In addition, of the above solvents, two or more solvents may be mixed at predetermined ratios.

The upper electrode layer 10 and the lower electrode layer 30 may comprise an electrically conductive material selected from the group consisting of metals, metal alloys, metal nitrides, metal oxides, metal sulfides, carbon and conductive polymers, organic conductors, and combinations thereof. The electrode material includes, for example, aluminum (Al), gold (Au), silver (Ag), platinum (Pt), copper (Cu), titanium (Ti), tungsten (W), or indium tin oxide (ITO), but is not limited thereto. In the case where the electrode layer is formed of an organic material, the memory device is formed only of the organic material, yielding a complete organic memory.

The conductive polymer includes, for example, phenylpolyacetylene polymers, such as polydiphenylacetylene, poly(t-butyl)diphenylacetylene, poly(trifluoromethyl)diphenylacetylene, poly(bistrifluoromethyl)acetylene, polybis(t-butyldiphenyl)acetylene, poly(trimethylsillyl)diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl)phenylacetylene, poly(trimethylsillyl) phenylacetylene and derivatives thereof, or polythiophenes.

The electrode layer is typically formed using a deposition process such as thermal deposition, a sputtering process, an e-beam evaporation process, a spin coating process, or other suitable processes known to those skilled in the art.

Figure 2:
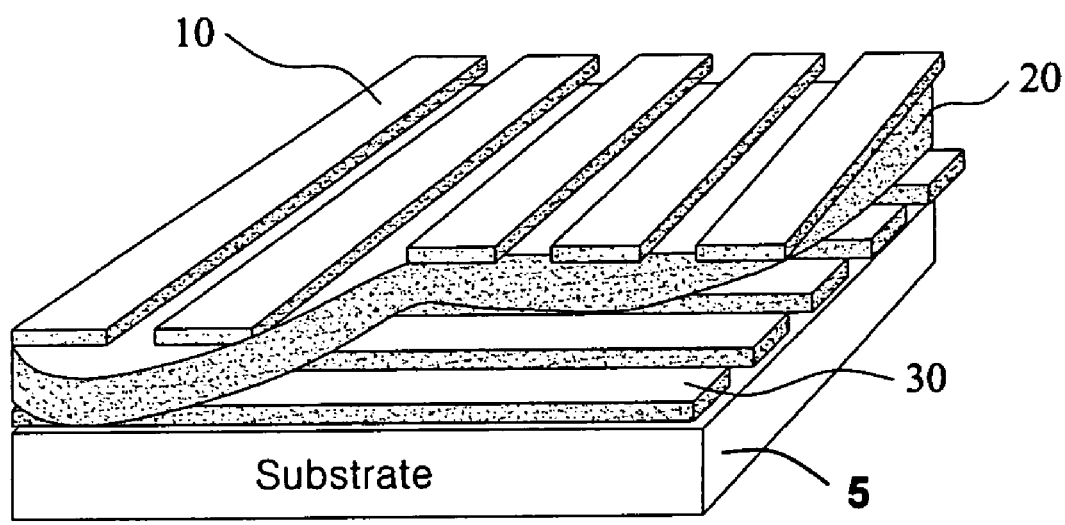
FIG. 2 is a schematic perspective view showing a memory matrix of the memory device according to an embodiment of the present invention.

FIG. 2 shows a memory matrix of the memory device according to an embodiment of the present invention. As shown in FIG. 2, the memory matrix is deposited on a predetermined substrate 5, such as glass or silicon. The memory matrix includes an upper electrode layer 10, a lower electrode layer 30, and a memory layer 20 sandwiched therebetween. As such, the substrate 5 may be a conventional organic or inorganic substrate, and in particular, a flexible substrate. The cells formed at intersections of the upper and lower electrode layers 10 and 20 provide bistability.

Figure 4:
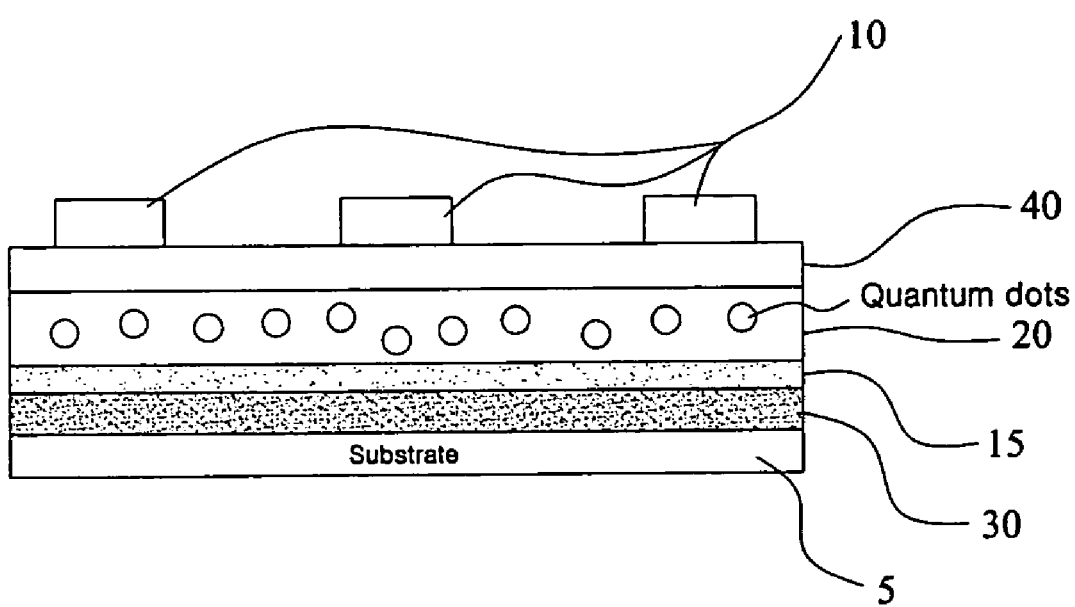
FIG. 4 is a schematic sectional view showing a memory device according to an embodiment of the present invention.

According to an embodiment of the present invention, a memory device further including a barrier layer formed on the lower electrode layer 30, a barrier layer formed beneath the upper electrode layer 10 to protect the upper electrode layer, or a combination of the two barrier layers is provided. FIG. 4 is a schematic sectional view showing a memory device including a barrier layer 40 beneath the upper electrode layer 10 and another barrier layer 15 on the lower electrode layer 30. As shown in FIG. 4, on the lower electrode layer 30, the barrier layer 15, the memory layer 20, the barrier layer 40 and the upper electrode layer 10, in that order, are formed. The barrier layers 15 and 40 may include a material selected from the group consisting of $SiO_x$, $AlO_x$, $NbO_x$, $TiO_x$, $CrO_x$, $VO_x$, $TaO_x$, $CuO_x$, $MgO_x$, $WO_x$, and $AlNO_x$, and preferably, include a material selected from the group consisting of $SiO_2$, $Al_2O_3$, $Cu_2O$, $TiO_2$, BN, and $V_2O_3$. A barrier layer of embodiments of the present invention may be formed of an organic material, such as Alq3, polymethylmethacrylate, polystyrene, PET, etc. The thickness of the barrier layers 15 and 40 is preferably in the range of from 20 to 300 Å.

A better understanding of embodiments of the present invention may be obtained in light of the following examples which are set forth to illustrate, but are not to be construed to limit the present invention.

PREPARATIVE EXAMPLE

Preparation of Quantum Dots

Cadmium acetate hydrate (1 mmol), trioctylphosphane (6 ml), bis(trimethylpentyl)phosphinic acid (1 mmol), Se (1 mmol) and oleylamine (3 ml) were mixed to prepare a mixture 1.7 ml of oleylamine and 8 ml of trioctylphosphane (TOP) were loaded into a round bottomed flask, to which the mixture 1 was added while maintaining the temperature in the flask at 250° C., and were then stirred for 1 hr. The obtained solution was mixed with hexane, and thus, a core was precipitated and separated using a centrifuge, to obtain a CdSe core. Subsequently, the core solution was dispersed in a solution of trioctylphosphaneoxide (12 g), oleylamine (3 ml), hexadecylamine (2 g), and bis(trimethylpentyl)phosphinic acid (1 mmol), after which hexane was removed under reduced pressure. To the resultant solution, a mixture of diethylzinc (1 mmol), hexamethyldisilthiane (1 mmol) and trioctylphosphane (7 ml) was added in droplets. This solution was stirred at 75° C. overnight and precipitated with methanol, thereby recovering quantum dots comprising CdSe (core)/ZnS (shell).

Example 1

On a glass substrate having an aluminum (Al) lower electrode layer deposited thereon, a solution of CdSe (core)/ZnS (shell) quantum dots (1 wt %) obtained in the Preparative Example and poly(3-hexylthiophene) conductive polymer (9 wt %) in toluene was spin coated at 2500 rpm for 30 sec, and then baked at 60° C. for 30 min. Then, a barrier layer (Alq3) was deposited to a thickness of 20 nm on the coated substrate, and copper (Cu) was deposited on the barrier layer to form an upper electrode layer, thus obtaining a memory device. As such, the memory layer was 15 nm thick, and the electrode layers were 80 nm thick, in which the thickness of each layer was measured using an alpha-step profilometer. The electrode layer was deposited using a thermal evaporation process and the thickness of the electrode layer to be deposited was controlled using a quartz crystal monitor.

Figure 5:
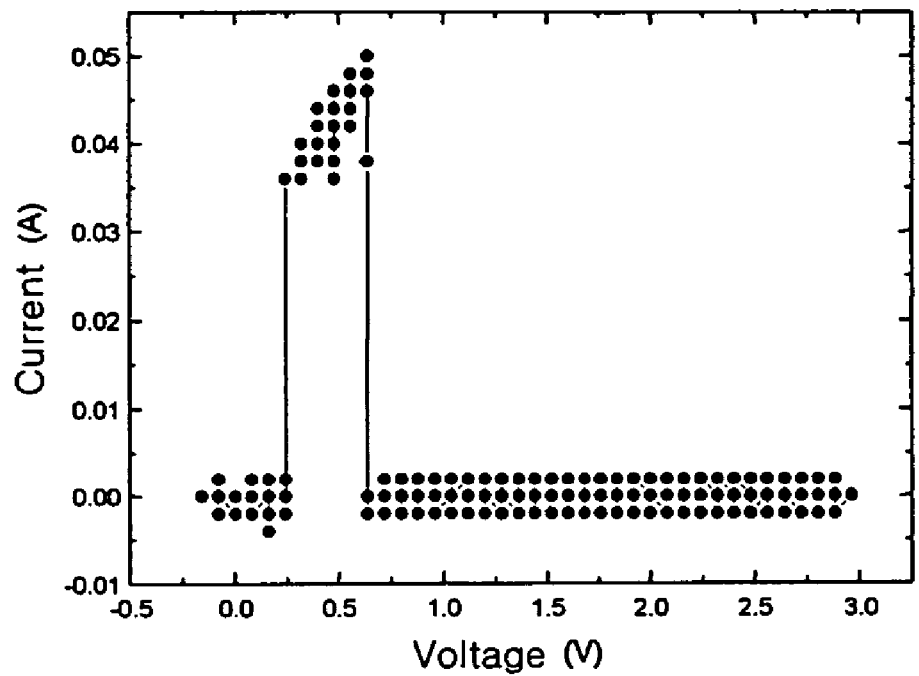
FIG. 5 is a graph showing current-voltage (I-V) of the memory device according to an embodiment of the present invention.

The current-voltage (I-V) curve of the above memory device is shown in FIG. 5, in which the voltage scan is 0.1 volt/sweep. As shown in FIG. 5, at a first bias sweep, current is drastically increased at about 0.25 V, and thus, the memory device is in a set state. Then, when the current is drastically decreased at 0.6 V, the device is in a reset state. The two states of the device differ in their current by 2 orders of magnitude. The current of the memory device is maintained high even at a low voltage through a second sweep following the voltage sweep of the device in the set state. Therefore, since a memory device of an embodiment of the present invention manifests bistability having two different resistance values at the same applied voltage, this device is found to have usability as nonvolatile memory.

Example 2

On a glass substrate having an aluminum (Al) lower electrode layer deposited thereon, a solution of CdSe (core)/CdS/ZnS (shell) quantum dots (1 wt %) and poly(3-hexylthiophene) conductive polymer (9 wt %) in chloroform was spin coated at 25000 rpm for 30 sec, and then baked at 60° C. for 30 min. Then, a barrier layer (Alq3) was deposited to a thickness of 20 nm on the coated substrate, and copper (Cu) was deposited on the barrier layer to form an upper electrode layer, thus obtaining a memory device. As such, the memory layer was 20 nm thick, and the electrode layers were 80 nm thick, the thickness of each layer being measured using an alpha-step profilometer. The electrode layer was deposited using a thermal evaporation process and the thickness of the electrode layer to be deposited was controlled using a quartz crystal monitor.

Figure 6:
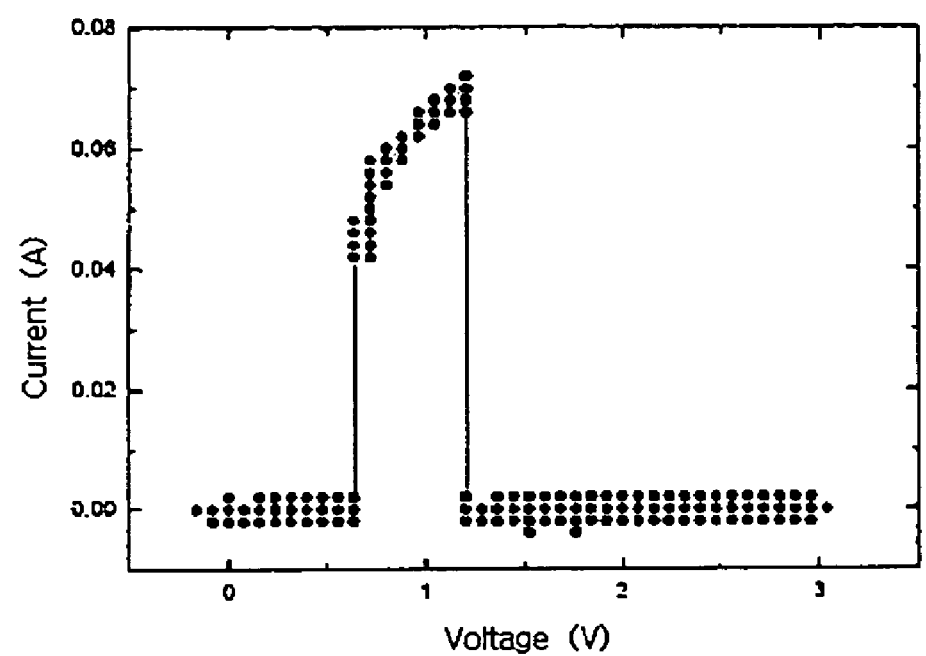
FIG. 6 is a graph showing current-voltage (I-V) of the memory device according to an embodiment of the present invention.

The current-voltage (I-V) curve of the above device is shown in FIG. 6, in which the voltage scan is 0.1 volt/sweep. As shown in FIG. 6, a memory device of an embodiment of the present invention is found to exhibit bistability and usability as a nonvolatile memory device.

As described hereinbefore, embodiments of the present invention provide an organic memory device, which is advantageous because it is nonvolatile and realizes high integration, high capacities, and high speed switching due to very fast switching from a high resistance state to a low resistance state. Since the size and distribution of the quantum dots are uniformly controlled, memory devices of embodiments of the present invention show more uniform memory behavior than electroformed devices. Further, the quantum dots, which are soluble in an organic solvent, are dissolved in a cosolvent along with a polymer to prepare a coating solution, which is then used for a simple process, such as spin coating, suitable for manufacturing memory devices of embodiments of the present invention less expensively. In addition, since the operating voltage of a memory device is remarkably decreased, a memory device is suitable for application to portable electronic devices that must have low power consumption.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:
1. A memory device, comprising:
    an upper electrode layer;
    a lower electrode layer; and
    a memory layer disposed between the upper electrode layer and the lower electrode layer,
    wherein the memory layer comprises quantum dots dispersed in an organic material, and
    wherein the quantum dots have a core-shell structure, and wherein the core is conductive and the shell is conductive.

2. The memory device as set forth in claim 1, wherein the quantum dots are Group II-VI quantum dots, Group III-V quantum dots, or Group IV quantum dots.

3. The memory device as set forth in claim 2, wherein the quantum dots are selected from the group consisting of CdS, CdSe, CdTe, ZnS, ZnSe, ZnTe, GaN, GaP, GaAs, GaSb, AlN, AlP, AlAs, AlSb, InP, InAs, InSb, and SiC.

4. The memory device as set forth in claim 1, wherein the core-shell structure is a core-shell alloy structure.

5. The memory device as set forth in claim 1, wherein the core is a Group II-VI compound semiconductor and the core-shell is a Group II-VI compound semiconductor.

6. The memory device as set forth in claim 1, wherein the size of the quantum dots is from 2 to 10 nm.

7. The memory device as set forth in claim 1, wherein the organic material is a conductive polymer.

8. The memory device as set forth in claim 7, wherein the conductive polymer is selected from the group consisting of phenylpolyacetylene polymers, including polydiphenylacetylene, poly(t-butyl)diphenylacetylene, poly(trifluoromethyl)diphenylacetylene, poly(bistrifluoromethyl)acetylene, polybis(t-butyldiphenyl)acetylene, poly(trimethylsillyl)diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl)phenylacetylene, poly(trimethylsillyl)phenylacetylene or derivatives thereof, polypyrroles, polyfurans, polyindoles, polyazulenes, polypyridines, polybipyridines, polyphthalocyanines, poly(3-hexylthiophenes) poly(ethylenedioxythiophenes), and derivatives thereof.

9. The memory device as set forth in claim 7, wherein the quantum dots and conductive polymer are dissolved in at least one organic solvent to form a coating solution, which is then used for spin coating.

10. The memory device as set forth in claim 1, wherein the memory layer has a thickness ranging from about 50 to 3000 Å.

11. The memory device as set forth in claim 1, wherein the memory layer is formed using a spin coating process, an inkjet printing process, a roll-to-roll coating process, or a thermal deposition process.

12. The memory device as set forth in claim 11, wherein a solvent used for spin coating is selected from the group consisting of acetone, cyclopentanone, cyclohexanone, methylethylketone ethylcellosolveacetate, butylacetate, ethyleneglycol, toluene, xylene, chloroform, tetrahydrofuran, dimethylformamide, acetonitrile, and chlorobenzene.

13. The memory device as set forth in claim 1, wherein the upper and lower electrode layers comprise a material selected from the group consisting of metals, metal oxides, conductive polymers, and organic conductors.

14. The memory device as set forth in claim 13, wherein the upper and lower electrode layers include a material selected from the group consisting of aluminum, gold, silver, platinum, copper, titanium, tungsten, and indium tin oxide.

15. The memory device as set forth in claim 1, wherein the memory device is in a form of a memory matrix.

16. The memory device as set forth in claim 1, further comprising a barrier layer formed beneath the upper electrode layer, on the lower electrode layer, or both.

17. The memory device as set forth in claim 16, wherein the barrier layer comprises an inorganic material selected from the group consisting of $SiO_x$, $AlO_x$, $NbO_x$, $TiO_x$, $CrO_x$, $VO_x$, $TaO_x$, $CuO_x$, $MgO_x$, $WO_x$, and $AlNO_x$, or an organic material selected from the group consisting of Alq3, polymethylmethacrylate, polystyrene, and PET.

18. The memory device as set forth in claim 17, wherein the barrier layer comprises a material selected from the group consisting of $SiO_2$, $Al_2O_3$, $Cu_2O$, $TiO_2$, BN, and $V_2O_3$.

19. The memory device as set forth in claim 16, wherein the barrier layer has a thickness ranging from about 20 to 300 Å.

20. The memory device as set forth in claim 1, wherein the upper and lower electrode layers and the memory layer are formed of an organic material.

21. The memory device as set forth in claim 1, wherein the quantum dots are all substantially uniform in size.

22. The memory device as set forth in claim 1, wherein the memory layer is configured such that
when a set voltage is applied between the upper and lower electrode layers, a resistance of the memory device is set to a relatively low resistance, and
when a reset voltage is applied between the upper and lower electrode layers, the resistance of the memory device is set to a relatively high resistance, and
wherein a magnitude of the set voltage is less than a magnitude of the reset voltage.

23. The memory device as set forth in claim 22, wherein the relatively high resistance and the relatively low resistance differ substantially by two orders of magnitude.

24. The memory device as set forth in claim 22, wherein the magnitudes of the set and reset voltages are substantially 0.25 V and 0.6 V, respectively, or are 0.7 V and 1.2 V, respectively.

25. The memory device as set forth in claim 1, wherein the core is formed from CdSe and the shell is formed from one or both of ZnS and CdS.

26. The memory device as set forth in claim 1, wherein the conductive polymer comprises poly(3-hexylthiophene).

27. A memory device using quantum dots, which comprises a memory layer comprising quantum dots dispersed in an organic material disposed between an upper electrode layer and a lower electrode layer,
wherein the organic material is a conductive polymer, and
wherein the conductive polymer is selected from the group consisting of phenylpolyacetylene polymers, including polydiphenylacetylene, poly(t-butyl)diphenylacetylene, poly(trifluoromethyl)diphenylacetylene, poly(bistrifluoromethyl)acetylene, polybis(t-butyldiphenyl)acetylene, poly(trimethylsillyl)diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl)phenylacetylene, poly(trimethylsillyl)phenylacetylene or derivatives thereof, polypyrroles, polyfurans, polyindoles, polyazulenes, polypyridines, polybipyridines, polyphthalocyanines, poly(3-hexylthiophenes) poly(ethylenedioxythiophenes), and derivatives thereof.

28. The memory device as set forth in claim 27, wherein the conductive polymer comprises phenyl polyacetylene.

29. The memory device as set forth in claim 27, wherein the conductive polymer comprises poly(3-hexylthiophene).

* * * * *